United States Patent
Miremadi

Patent Number: 5,473,461
Date of Patent: Dec. 5, 1995

[54] WIDE DYNAMIC RANGE OPTICAL RECEIVER

[75] Inventor: Reza Miremadi, Agoura, Calif.

[73] Assignee: Interactive Light, Inc., Santa Monica, Calif.

[21] Appl. No.: 297,266

[22] Filed: Aug. 26, 1994

[51] Int. Cl.[6] .................................. H04B 10/06
[52] U.S. Cl. ........................... 359/189; 250/214 B
[58] Field of Search ........................ 359/189–194; 250/214 B, 214 AL

[56] References Cited

U.S. PATENT DOCUMENTS

| | | | |
|---|---|---|---|
| 3,430,047 | 2/1969 | Hurkamp | 250/199 |
| 3,657,644 | 4/1972 | Beam et al. | 324/61 R |
| 3,737,799 | 6/1973 | Ständer | 455/306 |
| 3,751,667 | 8/1973 | Quittner | 250/214 |
| 3,777,568 | 12/1973 | Risgin et al. | 73/355 EM |
| 3,867,628 | 2/1975 | Brown | 250/214 |
| 3,968,361 | 7/1976 | Bumgardner | 359/189 |
| 4,061,925 | 12/1977 | van der Gaag et al. | 250/553 |
| 4,115,006 | 9/1978 | Reymond et al. | 250/214 B |
| 4,128,760 | 12/1978 | Del Signore, II | 250/214 B |
| 4,198,602 | 4/1980 | Nishijima et al. | 455/307 |
| 4,290,043 | 9/1981 | Kaplan | 359/155 |
| 4,303,855 | 12/1981 | Bapst et al. | 250/226 |
| 4,536,666 | 8/1985 | Metz et al. | 307/494 |
| 4,570,075 | 2/1986 | Spiero | 250/570 |
| 4,733,398 | 3/1988 | Shibagaki et al. | 372/31 |
| 4,792,682 | 12/1988 | Endou et al. | 250/349 |
| 4,792,997 | 12/1988 | Toussaint | 359/189 |
| 4,945,225 | 7/1990 | Gamgee et al. | 250/214 B |
| 5,039,952 | 8/1991 | Dreps et al. | 330/261 |
| 5,073,760 | 12/1991 | Richards | 330/201 |
| 5,090,708 | 2/1992 | Gerlitz | 455/79 |
| 5,194,823 | 3/1993 | Wendt | 330/137 |
| 5,307,196 | 4/1994 | Kinoshita | 359/189 |
| 5,373,388 | 12/1994 | Betts | 359/189 |

Primary Examiner—Leslie Pascal
Attorney, Agent, or Firm—Kirschstein, et al.

[57] ABSTRACT

Ambient light and temperature fluctuations are suppressed in an optical receiver system by feeding the output of a photodiode directly to one input of a differential amplifier and, via a low pass filter, to another input of the amplifier. Reductions in amplitude in an optical information signal are automatically compensated.

13 Claims, 3 Drawing Sheets

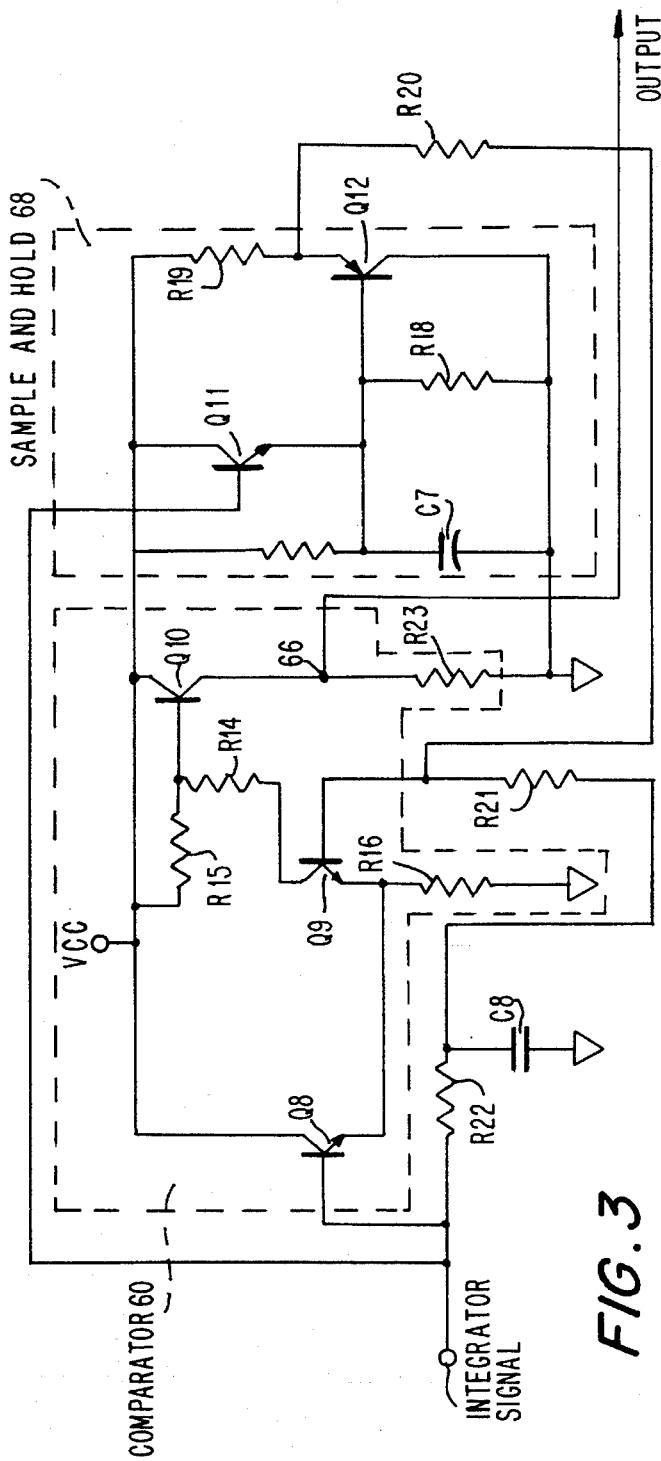
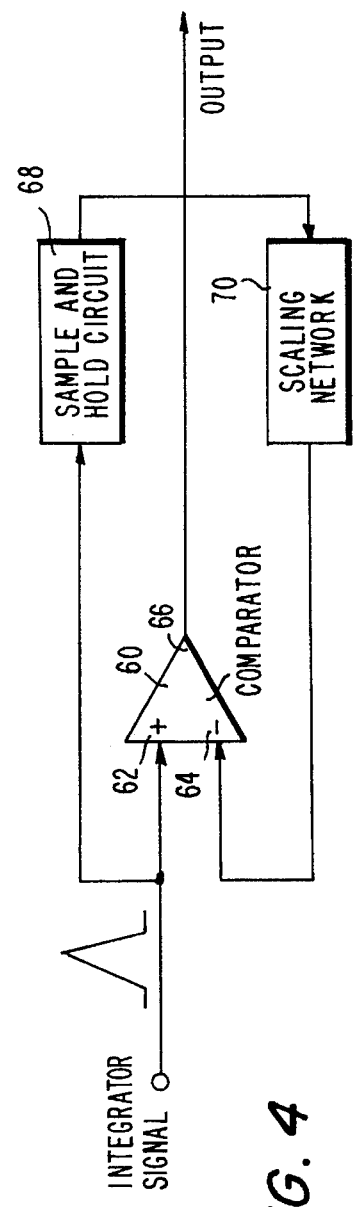
FIG. 3
FIG. 4

WIDE DYNAMIC RANGE OPTICAL RECEIVER

BACKGROUND OF THE INVENTION

1. Field of the Invention

This invention generally relates to an arrangement for, and a method of, discriminating an information signal from a background signal, and, more particularly, to automatically discriminating incident infrared light radiation from ambient light and temperature fluctuations in an optical receiver system for detecting the presence of an animate or inanimate object.

2. Description of the Related Art

There are many applications in which a sensor detects incident radiation, such as infrared light, and generates useful information signals therefrom. However, the sensor is sensitive not only to the incident radiation, but also to ambient light and temperature fluctuations whose detection leads to file generation of undesirable background noise signals. To obtain useful data, the background signals are removed from the information signals.

The following U.S. Pat. Nos. are exemplificative of known systems for removing background signals: 3,430,047; 3,657,644; 3,751,667; 3,777,568; 3,867,628; 4,061,925; 4,128,760; 4,115,006; 4,198,602; 4,303,855; 4,536,666; 4,570,075; 4,733,398; 4,792,682; 4,945,225; 5,039,952; and 5,073,760.

It will be seen that the known ambient light compensating circuitry is fairly complex and costly and, in many cases, impractical. The need persists for a relatively simple, reliable, inexpensive arrangement for discriminating between a radiation information signal and a background signal, especially over a wide dynamic range, and over variable environmental conditions.

SUMMARY OF THE INVENTION

1. Objects of the Invention

It is a general object of this invention to reliably suppress ambient light and temperature fluctuations from corrupting an information signal.

Another object of this invention is to provide a simple, reliable and inexpensive discrimination circuit utilizing a minimum of components.

An additional object of this invention is to provide an infrared receiver capable of operation over a wide dynamic range.

Yet another object of this invention is to generate high signal-to-noise ratio output signals in such optical-based receiver systems.

Another object of this invention is to automatically adjust such receiver systems to operate over variable environmental conditions.

2. Features of the Invention

In keeping with these objects and others which will become apparent hereinafter, one feature of this invention resides, briefly stated, in an arrangement for, and a method of, discriminating a high frequency, incident light radiation information signal from a low frequency background signal over a wide dynamic range and variable environmental conditions.

The arrangement includes sensor means sensitive to both the information and the background signals, and operative for generating a sensing signal containing both the information and the background signals. In the preferred embodiment, the sensor means is a photodiode for sensing infrared light pulses.

The arrangement further includes a differential amplifier means having first and second inputs, a gain, and an output. In addition, the arrangement includes low pass filter means having a low frequency passband.

In accordance with tiffs invention, means are provided for directly connecting the sensing signal to the first input of the differential amplifier means and, via the low pass filter means, to the second input of the differential amplifier means. The low pass filter means is operative for passing only the low frequency background signal. The differential amplifier means is operative for subtracting the background signal passed by the low pass filter means from the sensing signal to generate a differential output signal having a high signal-to-noise ratio.

In the preferred embodiment, the differential amplifier means includes a pair of back-to-back transistors having their bases serving as the first and second inputs, and a collector of one of the transistors serving as the output. The emitters of the transistors are interconnected and, in accordance with another feature of this invention, a constant current sink is connected between the interconnected emitters and ground. The current sink increases the common mode rejection ratio of the differential amplifier means which helps to reduce the background signal at the output of the differential amplifier means. The higher the common mode rejection ratio, the lower the background signal at the output.

An AC amplifier/high pass filter means is employed for amplifying the differential output signal and for further rejecting any residual low frequency background signals. In addition, an integrator means is operative for integrating the amplified and filtered differential output signal. When the photodiode detects an infrared light pulse, the output of the integrator means is a generally triangular waveform with the height of the triangle being proportional to the energy of the incoming infrared pulse. The output signal of the integrator is passed through a comparator, in which case, the output of the comparator has a pulse width that is proportional to the incoming infrared energy.

Although there are myriad applications where the arrangement of this invention can be used, the invention finds particular utility in relation to apparatus for detecting the presence of an object, e.g., a person, in an open area, such as an entranceway to a garage or a doorway to a room. The aforementioned pulse width is measured and compared to a reference value, thereby indicating the presence or absence of an object.

In the preferred embodiment, the arrangement is automatically compensated for such environmental conditions as dust, dirt or like factors that tend to reduce the energy of the incoming infrared pulse. Thus, a threshold value of the aforementioned comparator is automatically adjusted to be proportional to a peak value of the incoming infrared signal.

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 3 is a schematic of another part of the electrical circuit arrangement in accordance with the method of this invention;

FIG. 4 is a block diagram of the schematic circuit of FIG. 3; and

DETAILED DESCRIPTION OF THE PREFERRED EMBODIMENTS

Figure 1:
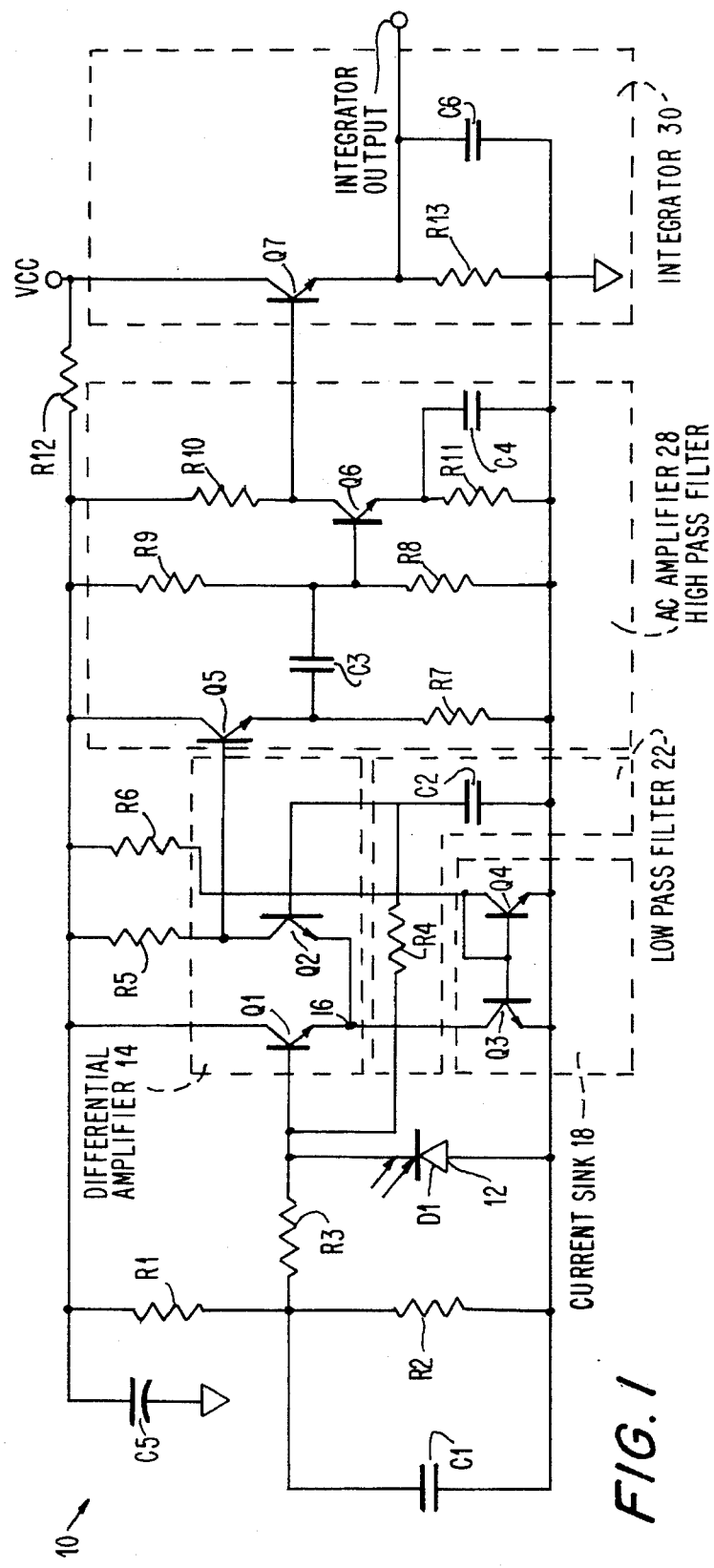
FIG. 1 is a schematic of a part of an electrical circuit arrangement in accordance with the method of this invention.

Referring now to the drawings, reference numeral 10 in FIG. 1 generally identifies a part of an electrical circuit arrangement in accordance with the method of this invention for discriminating a high frequency radiation information signal from a low frequency background signal over a wide dynamic range. Arrangement 10 includes an optical sensor, preferably a photodiode 12, sensitive to incident radiation, e.g., input pulses of infrared light. The infrared light pulses are emitted by a non-illustrated pulsed infrared transmitter.

The photodiode 12 is also sensitive to ambient light and temperature fluctuations. The arrangement is operative for generating an output signal, e.g., an output pulse having a width proportional to the input pulse energy, while substantially reducing, if not entirely eliminating, the effects of such ambient light and temperature fluctuations. As used herein and in the claims, the input pulse received by the photodiode is the useful information signal, whereas the ambient light mid temperature fluctuations represent the non-useful, background signal, also sometimes known as noise, which is intended to be suppressed by the instant invention.

Arrangement 10 utilizes a differential DC amplifier 14 which includes a pair of npn transistors Q1 and Q2 whose emitters are directly connected together at junction 16. The collector of transistor Q1 is connected to a supply voltage VCC, and the collector of transistor Q2 is connected to the supply voltage via a resistor R5. A constant current sink 18 is composed of another pair of npn transistors Q3 and Q4. The collector of transistor Q3 is connected between the junction 16 and ground. The collector of transistor Q4 is connected through a resistor R6 to the supply voltage. A biasing network consisting of resistors R1, R2 and R3, as well as capacitors C1 and C5, are connected, as shown, to the base of transistor Q1 to provide a low noise bias therefor.

The cathode of the photodiode 12 is also connected to the base of the transistor Q1. The photodiode 12, as described above, generates an input sensing signal composed of low frequency signals due to ambient light and low frequency noise (60 Hz and 120 Hz) and a high frequency signal due to the received infrared radiation. This input sensing signal is conducted to the base of the transistor Q1 which is identified as positive input terminal 20 in FIG. 2. The input sensing signal at the base of the transistor Q1 is also routed through a low pass filter 22 consisting of a resistor R4 and a capacitor C2 to the base of the transistor Q2. The base of transistor Q2 is identified as negative input terminal 24 in FIG. 2. The low pass filter has a passband ranging from DC to 160 Hz. The differential amplifier 14 is operative to subtract the low frequency background signal at terminal 24 from the input sensing signal consisting of both the low frequency background signal and the high frequency information signal at input terminal 20, thereby generating a differential output signal at the collector of transistor Q2.

Figure 2:
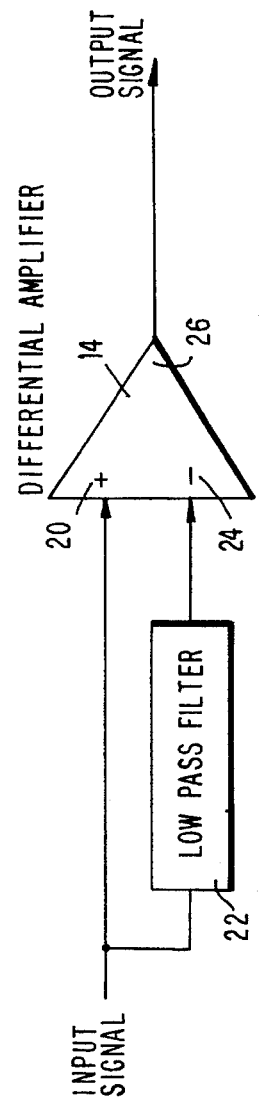
FIG. 2 is a block diagram of part of the schematic circuit of FIG. 1.

The collector of transistor Q2 is identified as output terminal 26 in FIG. 2. The differential output signal is formed across resistor R5 and contains mainly the high frequency information signal, since the low frequency background signal has been attenuated by the differential amplifier. The constant current sink increases the common mode rejection ratio of the differential amplifier which helps to reduce the background signal at the output of the differential amplifier. The higher the common mode rejection ratio, the lower the background signal at the output of the differential amplifier.

The differential output signal is next conducted to an AC amplifier/high pass filter 28 consisting of another pair of npn transistors Q5 and Q6. A DC blocking capacitor C3 is connected between the emitter of transistor Q5 and the base of transistor Q6. The amplifier/filter 28 amplifies and filters the differential output signal in order to further reject any residual background signal that may have exited the differential amplifier. The resulting amplified and filtered signal at the collector of the transistor Q6 is conducted through an npn transistor Q7 which is configured as a buffer/integrator by the resistor R13 and the capacitor C6.

The output signal from the integrator 30 is a generally triangular waveform with the height of the triangle being proportional to the energy of the incoming infrared pulse. This output signal is next passed through a comparator 60, as shown in FIGS. 3 and 4. The output of the comparator is a pulse having a width proportional to the incoming infrared energy. This pulse width can then be measured and used for various functions such as those described in co-pending U.S. patent application Ser. No. 08/248,434 filed May 24, 1994, commonly owned with the assignee of the instant application, the entire contents of said co-pending application being hereby incorporated by reference herein.

The comparator 60 includes a pair of back-to-back, npn transistors Q8 and Q9 where emitters are interconnected and grounded through resistor R16. The collector of transistor Q8 is connected to the supply voltage VCC. The collector of transistor Q9 is connected via resistors R14, R15 and transistor Q10 to the supply voltage. The base of transistor Q8 serves as the non-inverting input 62 of the comparator. The base of transistor Q9 serves as the inverting input 64 of the comparator. The output of the comparator is labeled at terminal 66.

The output signal of the integrator is fed to the non-inverting input 62, and is also fed to a sample and hold circuit 68 which consists of transistors Q11 and Q12, resistors R17, R18 and R19 and capacitor C7 connected as shown. The sample and hold circuit 68 captures the peak amplitude of the triangular output signal from the integrator 30.

The output of the sample and hold circuit 68 is conducted to a scaling network 70 which consists of resistors R20, R21, R22 and capacitor C8, prior to being conducted to the inverting input 64 of the comparator. The resistors R20 and R21 are chosen to set the threshold value at the input 64 to always be a fraction, e.g., one-third, of the peak value. In this way, if the energy of the incoming infrared pulse is reduced, the arrangement automatically compensates by adjusting the threshold of the comparator.

Figure 5:
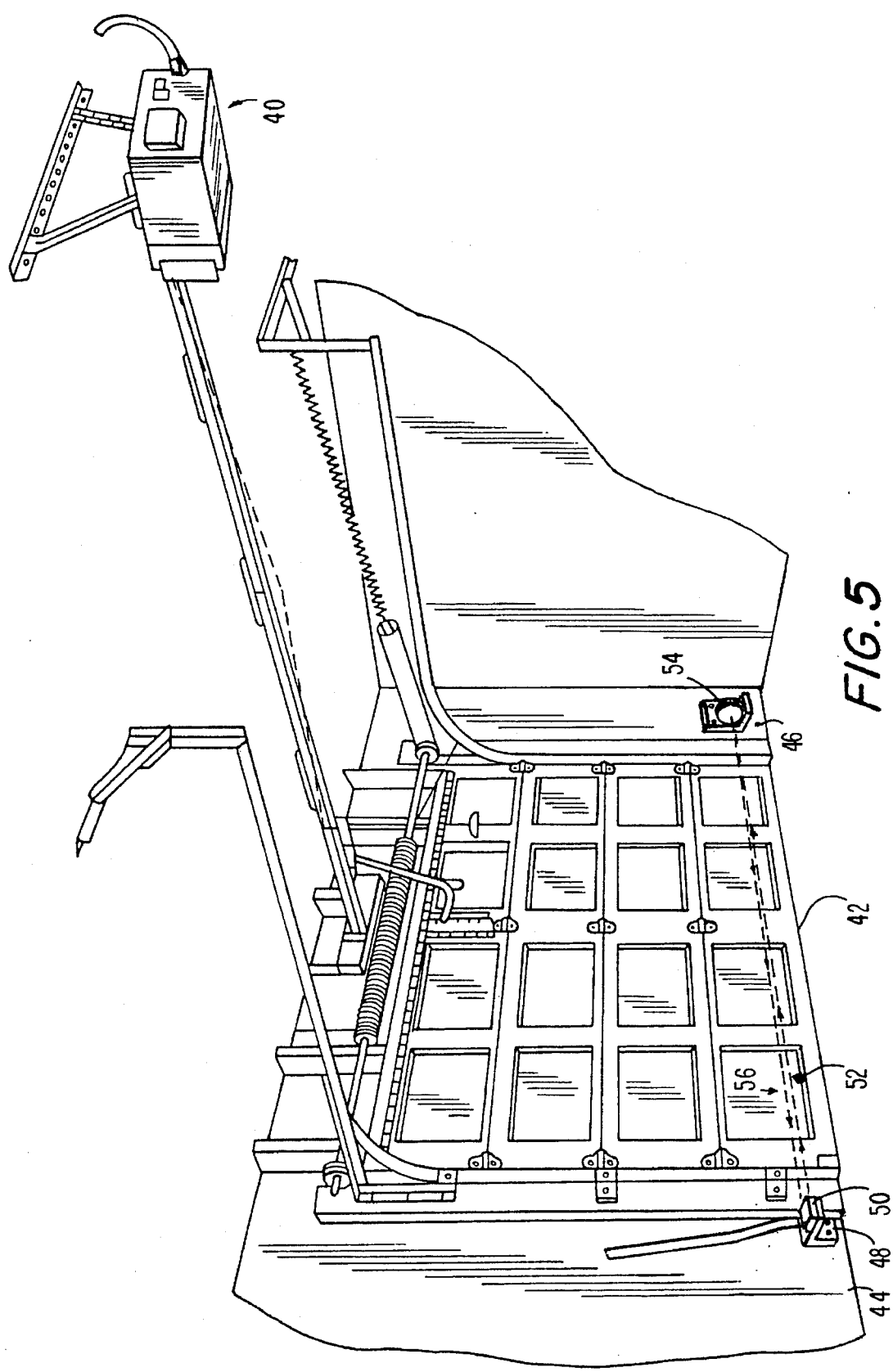
FIG. 5 depicts a preferred application of the circuit of FIG. 1 in use.

The currently preferred application for the instant invention relates to detecting an object, e.g., a person, in an enhanceway of a garage. Thus, as shown in FIG. 5, a typical residential garage door operator system as viewed from inside a garage includes an overhead receiver/operator unit 40 with an internal reversible drive motor operative through a force-transmitting transmission to raise or lower or otherwise control a door 42. The door 42 is mounted in an open area or entranceway between a pair of jambs or upright sidewalls 44, 46. The arrangement 10 in accordance with this invention is mounted in housing 50 preferably mounted on one of the sidewalls, e.g., sidewall 44 with the aid of an adjustable, stand-off bracket 48. In operation, the presence or absence of an object, e.g., a person, thing or analogous obstruction, in the entranceway is employed for controlling movement of the door 42 in accordance with such detection.

A transmitter mounted in the housing 50 is operative for transmitting a light beam 52 along a first optical path extending in a first direction across the entranceway to a retro-reflective element 54 for reflection therefrom. The retro-reflective element 54 reflects a major portion of the light beam back toward the housing 50. The reflected light beam 56 travels back in an opposite direction generally parallel to the first direction across the entranceway for receipt by the sensor 12.

A programmed microprocessor may be located within the housing 50 and is operative, as described in said co-pending application, for pulsing the transmitter, and for analyzing the pulse width of the output signal of the arrangement of FIG. 1. The pulse width is indicative of the presence or absence of an object in the area. Thus, a pulse width equal to or exceeding a certain value would be interpreted as indicating that the area is free of any object, thereby allowing the door 42 to close, whereas a pulse width below the certain value would be interpreted as indicating that the area contains an obstruction, thereby stopping or reversing the closing door 42.

In the application depicted in FIG. 5, the ambient light level fluctuates as sunlight varies during the day, as headlights or other outdoor lights vary, as indoor lights are switched on and off, etc. The greater the ambient light level, the shorter the pulse width, and vice versa. In some cases, the ambient light level can corrupt the pulse width determination and lead to an incorrect determination whether an object is or is not present in the area, possibly leading to personal injury and/or property damage. This invention is directed, among other things, to prevent such corruption. Also, if energy is reduced at the sensor due, for example, to dust or dirt on the element 54, the sample and hold circuit and the scaling network automatically compensates for such energy reduction.

As can be seen from FIG. 2, the signal path of the input sensing signal is always moving forward without any feedback. This feature allows the circuit to have a wide dynamic range, e.g., at least 10, and a wide bandwidth. It also allows the amplifier to have a large single stage gain, e.g., on the order of 30–50. A large gain stage at the input greatly maximizes the signal-to-noise ratio, e.g., at least 10, of the input sensing signal. Negative feedback as suggested by the prior art, reduces the gain of the amplifier so that the dynamic range, the bandwidth and the signal-to- noise ratio all suffer. Finally, the differential amplifier can have a linear output characteristic.

It will be understood that each of the elements described above, or two or more together, also may find a useful application in other types of constructions differing from the types described above.

While the invention has been illustrated and described as embodied in a wide dynamic range optical receiver, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

I claim:

1. An arrangement for discriminating a high frequency, incident light radiation information analog signal of variable amplitude from a low frequency background analog signal over a wide dynamic range in a receiver, comprising:

optical sensor means sensitive to both the information and the background analog signals, for generating a sensing analog signal containing both the information and the background analog signals;

differential amplifier means having first and second inputs, a gain and an output;

low pass filter means having a low frequency passband;

means for directly connecting the sensing analog signal to the first input of the differential amplifier means and to the low pass filter means, and means for directly connecting the low pass filter means to the second input of the differential amplifier means;

said low pass filter means being operative for passing only the low frequency background analog signal to the second input of the differential amplifier means; and said differential amplifier means being operative for subtracting the background analog signal from the sensing analog signal to generate a differential output analog signal whose amplitude is directly proportional to the variable amplitude of the information analog signal, and whose signal-to-noise ratio is high, both said signal-to-noise ratio and said dynamic range increasing in value as the difference between the sensing analog signal and the background analog signal at the inputs of the differential amplifier means increases in value.

2. The arrangement according to claim 1, wherein the sensor means is a photodiode for sensing incident light radiation and ambient light as the information and background analog signals, respectively.

3. The arrangement according to claim 2, wherein the photodiode detects infrared light pulses.

4. The arrangement according to claim 1, wherein the differential amplifier means includes a pair of transistors having their bases serving as the first and second inputs, and a collector of one of the transistors serving as the output.

5. The arrangement according to claim 4, wherein the transistors have emitters interconnected; and further comprising a constant current sink connected between the interconnected emitters and ground.

6. The arrangement according to claim 1; and further comprising an AC amplifier/filter means for amplifying the differential output analog signal and attenuating the background analog signal.

7. The arrangement according to claim 6; and further comprising an integrator means for integrating the amplified differential output analog signal to obtain an integrated analog signal.

8. The arrangement according to claim 7; and further comprising comparator means having one input to which the integrated analog signal is conducted, and another input, and an output at which a pulse is generated, said pulse having a width proportional to the information analog signal; and means for automatically adjusting a threshold signal conducted to said another input.

9. The arrangement according to claim 8, wherein the adjusting means includes means for generating a peak value of the integrated analog signal, and means for deriving a fixed, fractional value of said peak value for conduction to said another input.

10. A method of discriminating a high frequency, incident light radiation information analog signal of variable amplitude from a low frequency background analog signal over a wide dynamic range in a receiver, comprising the steps of:

generating an optical sensing analog signal containing both the information and the background analog signals;

extracting the background analog signal frown the sensing analog signal by directly connecting the sensing analog signal to a first input of a differential amplifier and also to an input of a low pass filter, and by directly connecting an output of the low pass filter to a second input of the differential amplifier; and subtracting the extracted background analog signal from the sensing analog signal to generate a differential output analog signal whose amplitude is directly proportional to the variable amplitude of the information analog signal, and whose signal-to-noise ratio is high, both said signal-to-noise ratio and said dynamic range increasing in value as the difference between the sensing analog signal and the background analog signal at the inputs of the differential amplifier increases in value.

11. The method according to claim 10, wherein the extracting step is performed by low pass filtering the sensing analog signal.

12. The method according to claim 10; and further comprising the step of automatically compensating for a reduction in amplitude of the information analog signal by processing the differential output analog signal to have a peak value, and by comparing the peak value with a fixed, fractional value of the peak value.

13. A system for detecting an object in an area subject to environmental variations, comprising:

optical sensor means sensitive to high frequency, incident light radiation and to low frequency, ambient light, and for respectively generating information and background analog signals;

means for discriminating the information analog signal from the background analog signal, and for attenuating the background analog signal; and means for automatically compensating for a change in amplitude of the information analog signal by generating an adjustable scaled amplitude of the information analog signal, and by comparing the information analog signal against said adjustable scaled amplitude.

* * * * *